US 6,771,677 B2

(12) United States Patent
Furukawa et al.

(10) Patent No.: US 6,771,677 B2
(45) Date of Patent: Aug. 3, 2004

(54) OPTICAL DEVICE STRUCTURE AND FABRICATION METHOD THEREOF

(75) Inventors: Yukio Furukawa, Kanagawa-ken (JP); Toshihiko Ouchi, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/243,771

(22) Filed: Sep. 16, 2002

(65) Prior Publication Data

US 2003/0016715 A1 Jan. 23, 2003

Related U.S. Application Data

(62) Division of application No. 09/158,820, filed on Sep. 23, 1998, now Pat. No. 6,507,594.

(30) Foreign Application Priority Data

Sep. 30, 1997 (JP) .............................. 9-282549
Sep. 7, 1998 (JP) ........................... 10-268951

(51) Int. Cl.⁷ .......................... H01S 5/022; H01L 23/48
(52) U.S. Cl. ......................... 372/36; 257/734; 257/741; 257/778; 372/34; 372/96
(58) Field of Search .................... 372/36, 96; 257/734, 257/741, 778

(56) References Cited

U.S. PATENT DOCUMENTS

| 4,780,371 A | 10/1988 | Joseph et al. ............... 428/414 |
| 5,258,577 A | 11/1993 | Clements .................. 174/88 R |
| 5,431,571 A | 7/1995 | Hanrahan et al. ............. 439/91 |
| 5,438,223 A | 8/1995 | Higashi et al. .............. 257/734 |
| 5,586,892 A | 12/1996 | Sato ............................ 439/91 |
| 5,637,176 A | 6/1997 | Gilleo et al. ................. 156/277 |
| 5,701,325 A | * 12/1997 | Ouchi et al. .................. 372/96 |
| 6,002,180 A | * 12/1999 | Akram et al. ................ 257/783 |
| 6,011,307 A | 1/2000 | Jiang et al. ................. 257/741 |
| 6,088,378 A | 7/2000 | Furukawa .................... 372/92 |
| 6,222,868 B1 | 4/2001 | Ouchi et al. .................. 372/50 |
| 6,261,859 B1 | 7/2001 | Ouchi .......................... 438/39 |

FOREIGN PATENT DOCUMENTS

| JP | 62-165886 | 7/1987 |
| JP | 62-260877 | 11/1987 |
| JP | 7-283486 | 10/1995 |
| JP | 0 704 947 | 3/1996 |
| JP | 8-153935 | 6/1996 |

OTHER PUBLICATIONS

D. D. Chang et al., "An Overview And Evaluation of Anisotropically Conductive Adhesive Films For Fine Pitch Electronic Assembly", IEEE Transactions on Components, Hybrids, And Manufacturing Technology, IEEE Inc., N w York, U. S., vol. 16 No. 8, 1 D cember 1993 (Dec. 01, 1993) pp. 828–834, XP000443354 ISSN: 0148–6411 *pag 828–830*.

* cited by examiner

Primary Examiner—James W. Davie
(74) Attorney, Agent, or Firm—Fitzpatrick, Cella, Harper & Scinto

(57) ABSTRACT

An optical device structure includes a first substrate structure and a second substrate structure. The first substrate structure includes a first substrate, at least an active region formed on the first substrate, and at least a first electric connector portion provided corresponding to the active region for injecting a current into or applying a voltage to the active region. The second substrate structure includes a second substrate, and at least a second electric connector portion formed on the second substrate corresponding to the first electric connector portion. The first and second substrates are bonded to each other using an anisotropic electrically-conductive adhesive containing electrically-conductive particles and having an elctrically-conductive characteristic only in a direction perpendicular to the first and second substrates, such that the corresponding first and second electric connector portions on the first and second substrates are electrically connected to each other.

16 Claims, 9 Drawing Sheets

OPTICAL DEVICE STRUCTURE AND FABRICATION METHOD THEREOF

This application is a division of application Ser. No. 09/158,820, filed Sep. 23, 1998 now U.S. Pat. No. 6,507,594.

BACKGROUND OF THE INVENTION

1. Field of the Invention

The present invention relates to an optical device structure including an optical device, such as a light emitting semiconductor device, a light detecting semiconductor device and a surface emitting semiconductor laser, typically a vertical cavity surface emitting laser (VCSEL), whose thermal radiation characteristic is prominent and which is suitable for use in a two-dimensional array structure, for example, and its fabrication method.

2. Related Background Art

Recently, development of a solid-state light emittiing laser device of a two-dimensional array type has been desired for the purpose of its applications to large-capacity parallel optical information processing, high-speed optical connection and panel-type display apparatus. As a light emitting device suitable for the arraying, the VCSEL has been watched with keen interest and studied. The VCSEL normally includes a Fabry-Perot cavity with upper and lower reflection mirrors and a cavity length of several microns. To achieve a low threshold, such a reflection mirror as has small absorptivity for oscillation wavelength and has a high reflectance, is required. For this purpose, the mirror is normally comprised of a multi-layer structure of alternately layered layers of two kinds with different refractive indices and a thickness of a quarter of the oscillation wavelength.

Surface emitting semiconductor lasers with a variety of oscillation wavelengths can be fabricated by selecting semiconductor material according to the wavelength. Among them, surface emitting semiconductor lasers of GaAs series with oscillation wavelengths of 0.85 $\mu$m and 0.98 $\mu$m and of InP series with oscillation wavelengths of 1.3 $\mu$m and 1.55 $\mu$m are well known.

In the case of GaAs series, a multi-layer of AlAs/(Al)GaAs is generally used as mirror because this can be epitaxially grown on a GaAs substrate. On the other hand, in the case of InP series, since an index difference between InGaAsP and InP, which can be epitaxially grown on an InP substrate, is small and a high reflectance is hence difficult to obtain, materials other than InGaAsP/InP, such as $SiO_2$/Si multi-layer and an $Al_2O_3$/Si multi-layer, is used.

Further, the following method is known: to semiconductor layers including an active layer grown on an InP substrate, a multi-layer of AlAs/(Al)GaAs grown on another GaAs substrate is bonded.

As a method for providing an electrode leader structure in arrayed surface mitting semiconductor lasers, there exists a method in which an electrode-leader pattern is directly formed on the surface of the surface emitting semiconductor lasers. There has also been proposed a method in which a leader wire pattern is formed on a substrate other than a growth substrate and the laser substrate is bonded to the other substrate.

Figure 1:
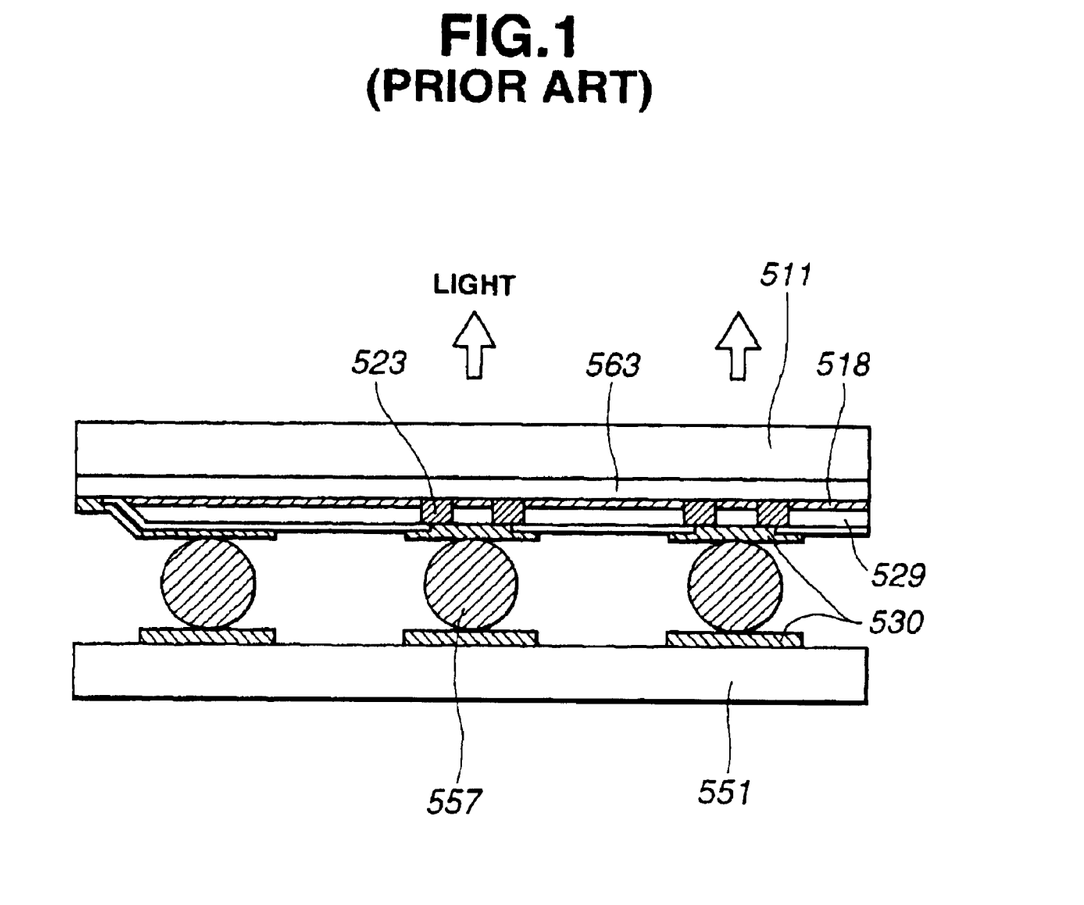
FIG. 1 is a cross-sectional view illustrating the structure of a first prior art light emitting device structure.

For example, Japanese Patent Laid-Open No. 7-283486 (published in 1995) discloses a technique according to which an electrode 530 on an AlN substrate 551 with an electronic circuit (not shown) is electrically connected to an electrode 530 on a surface of a surface emitting semiconductor laser formed on an AlGaAs substrate 511 by using solder bumps 557, as illustrated in FIG. 1. If needed, surroundings of the solder bumps may be buried with resin. The surface emitting semiconductor laser includes a light emitting layer 518 sandwiched between mirrors 529 and 563 and surrounded by polyimide 523.

Figure 2:
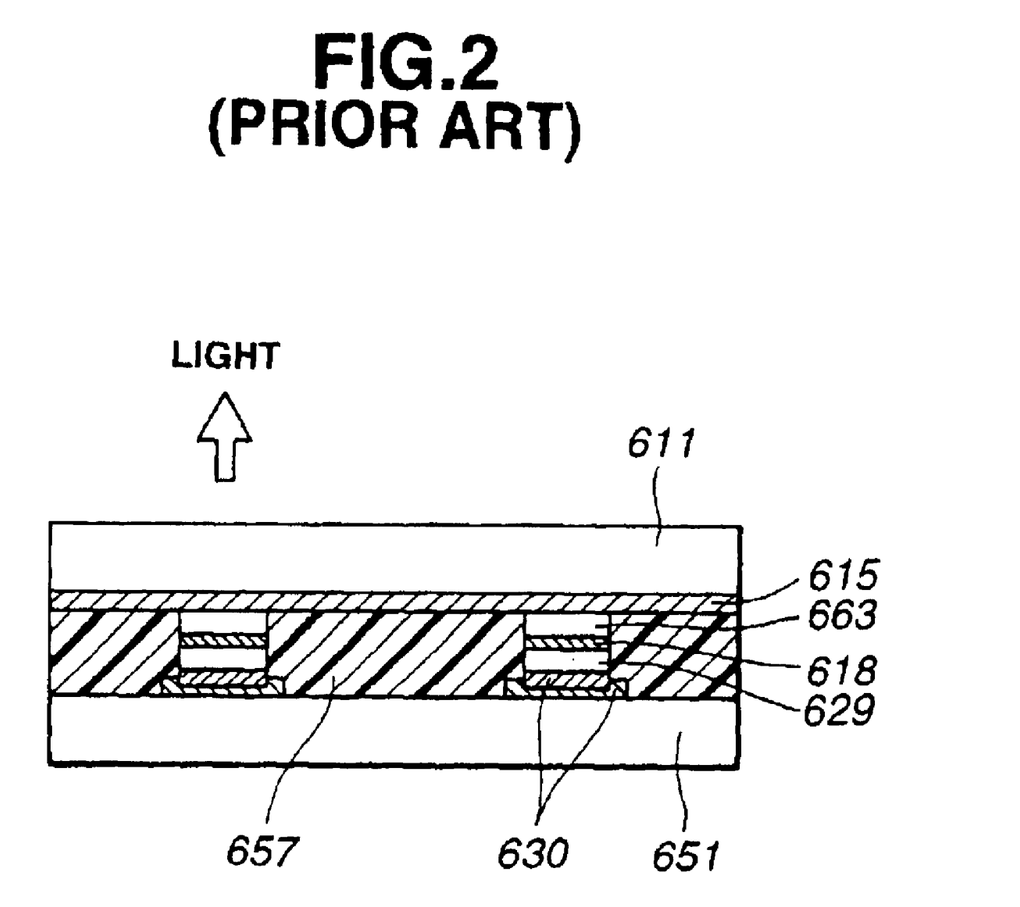
FIG. 2 is a cross-sectional view illustrating the structure of a second prior art light emitting device structure.

As another example, Japanese Patent Laid-Open No. 8-153935 (published in 1996) discloses a technique according to which an electrode 630 on a substrate 651 (a second substrate) with an electric leader wire is directly bonded to an electrode 630 on a surface of a surface emitting semiconductor laser formed on a first substrate 611 and surroundings of the electrodes 630 are buried and set with resin 657, as illustrated in FIG. 2. The surface emitting semiconductor laser includes a buffer layer 615 and a light emitting layer 618 sandwiched by mirrors 629 and 663.

However, where the electrode leader wire pattern is directly formed on the surface emitting semiconductor laser, a use efficiency of a laser wafer is lowered and its cost increases since an electrode pad is needed around the laser region.

Further, where the leader wire pattern is formed on another substrate and the another substrate is bonded to the laser substrate, for example, in the case of the electrode leader structure using solder bumps illustrated in FIG. 1, the interval between the active layer and the substrate with the electric leader wire is determined by the diameter of the bump which ranges from several tens microns to a hundred microns (that is, the interval cannot be less than the diameter of the bump). Thus, its thermal radiation characteristic is not satisfactory. Additionally, since a multiplicity of solder bumps must be placed on determined positions, its fabrication process inevitably becomes complicated.

Where the electrode on the substrate with the electric leader wire thereon is directly bonded to the electrode on the surface of the surface emitting semiconductor laser and surroundings thereof is set with the resin as illustrated in FIG. 2, the interval between the active layer and the substrate (second substrate) with the electric wire thereon can be reduced, compared to the case of FIG. 1. An electric resistance, however, increases due to the resin inserted between the upper and lower electrodes, and those electrodes will be insulated from each other in the worst case. Thus, the yield is impaired. Further, such a structure is vulnerable to its surface conditions. If insulating dusts are on the surface or the surface is covered with an oxidized film, it is difficult to achieve a preferable electric contact.

Further, with the surface emitting semiconductor laser, the substrate should be removed depending on the relation between semiconductor material and oscillation wavelength. For example, where a surface emitting semiconductor laser for emitting an oscillation wavelength of 0.85 $\mu$m uses a GaAs substrate, the substrate needs to be removed to take light from the substrate side as the GaAs substrate is opaque to the oscillation wavelength.

As another example, where a surface emitting semiconductor laser for emitting an oscillation wavelength of 1.3 $\mu$m or 1.55 $\mu$m using an InP substrate, it is necessary to deposit a multi-layer mirror of dielectrics after removing the InP substrate. For this purpose, presently the semiconductor substrate is etched in the form of a hole in accordance with a light emitting region of the surface emitting semiconductor laser. Such a hole-etching is difficult to carry out with good reproducibility. Further, the hole-etching for each semiconductor laser is likely to be a factor for preventing a high-density configuration in the case of the arrayed semiconductor lasers. Moreover, it is also difficult to form a multi-layer, such as $SiO_2/Si$ multi-layer and $Al_2O_3/Si$ multi-layer, in the hole with good reproducibility, leading to a decrease in the yield.

Also with the cases of FIGS. 1 and 2, the substrate needs to be removed depending on the relation between semiconductor material and wavelength (in the case of FIG. 1, although the AlGaAs substrate, which is transparent to the oscillation wavelength, is used to make the substrate removal unnecessary, such an AlGaAs substrate is not generally used and its cost is high). In those cases, the following problem occurs. It can be considered that after the laser substrate is bonded to the substrate with the electrode thereon, all the laser substrate (semiconductor substrate) is removed with the electrode substrate acting as a support substrate. In those cases, the overall removal of the semiconductor substrate is, however, not taken into consideration. Specifically, the problem occurs that stresses are applied to the active layer due to thermal expansion and the like when the layer thickness after the removal comes to be several microns, and hence the oscillation threshold increases and the efficiency decreases.

SUMMARY OF THE INVENTION

An object of the present invention is to provide an optical device structure, such as a VCSEL structure, whose thermal radiation characteristic is excellent and which can be readily fabricated, and its fabrication method.

An optical device structure for achieving the object of the present invention includes a first substrate structure and a second substrate structure. The first substrate structure includes a first substrate, at least an active region formed on the first substrate, and at least a first electric connector portion provided corresponding to the active region for injecting a current into or applying a voltage to the active region. The second substrate structure includes a second substrate, and at least a second electric connector portion formed on the second substrate each corresponding to the first electric connector portion. The first and second substrates are bonded to each other by an anisotropic electrically-conductive adhesive containing electrically-conductive particles and having an electrically-conductive characteristic only in a direction perpendicular to the first and second substrates, such that the corresponding first and second electric connector portions on the first and second substrates are electrically connected to each other. In such a structure, an interval between an active layer in the active region and the second substrate structure can be reduced, so that heat generated in the active layer can be effectively radiated towards a side of the second substrate structure.

Based on the above fundamental structure, following specific structures are possible with following technical advantages.

The second substrate structure may further include at least one of an electric leader wire and an electronic circuit formed on the second substrate and connected to the second electric connector portion.

The first and second electric connector portions may include an electrode formed on a surface of each of the first and second substrates, and an uppermost surface of the electrode may protrude from other portion of at least one of the first and second substrates such that an interval between the electrodes on the first and second substrates is smaller than an interval between the other portions on the first and second substrates. According to this structure, an electric contact between the first and second electric connector portions can be assuredly established, and the yield can be further improved.

The uppermost surface of the electrode may protrude from the other portion of at least one of the first and second substrates such that the interval between the other portions on the first and second substrates is far larger than a diameter of the electrically-conductive particle. According to this structure, an electric contact between the other portions on the first and second substrates can be assuredly prevented, and the yield can be further improved.

An insulating layer may be provided on at least one of the first and second substrates except for regions of the first and second electric connector portions. Also in this structure, an electric contact between the other portions on the first and second substrates can be assuredly prevented, and the yield can be further improved.

The active region may comprise a light emitting region, a light receiving region, or the like.

When the active region is a light emitting region, the first substrate structure may include a first multi-layer mirror, epitaxially-grown semiconductor layers including an active layer, and a second multi-layer mirror to construct a surface emitting semiconductor laser for emitting light from a side of the first substrate.

At least a portion (ex., all or almost all) of the first substrate may be removed. With this structure, the first substrate can be removed without the hole-etching for each active region, so the fabrication method can be simplified and the productivity can be enhanced. Further, the device structure can be stably built and light can be readily output or input from the side of the first substrate (the growth substrate), so that the arraying of the optical devices can be readily achieved.

An area of the first electric connector portion may be larger than an area of the active region. With this structure, transfer of stresses generated by shrinkage, thermal expansion and the like of the adhesive to the optical region is made difficult. Therefore, characteristics of the optical device would not be injured even when the growth substrate is removed.

The active region may include a first protruding portion with a first multi-layer mirror and an electrode of the first electric connector portion, and an area of the first multi-layer mirror may be far larger than an area of an active layer formed in the active region. Also with this structure, transfer of stresses generated by shrinkage, thermal expansion and the like of the adhesive to the optical region is made difficult.

The first substrate structure may include a first protruding portion with the first electric connector portion formed corresponding to the active region and a second protruding portion formed near the active region, a height of the first protruding portion may be larger than a height of the second protruding portion, the first protruding portion may be electrically connected to the second electric connector portion through the first electric connector portion, and the second protruding portion may be insulated from the second electric connector portion. Also with this structure, characteristics of the optical device would not be injured even when the growth substrate is removed. In this structure, the first protruding portion may include a multi-layer mirror and an electrode of the first electric connector portion, and the second protruding portion may also include a multi-layer mirror.

The first substrate structure may include a first protruding portion with the first electric connector portion formed corresponding to the active region and a second protruding portion with the first electric connector portion formed near the active region, a height of the first protruding portion may be substantially equal to a height of the second protruding portion, the first protruding portion may be electrically connected to the second electric connector portion through the first electric connector portion, and the second protruding portion may also be electrically connected to the second electric connector portion through the first electric connector portion. With this structure, both electrodes of the active region can be taken from the same side of the substrate, so the electric wiring can be simplified and the productivity can be enhanced. Further, also in this structure, transfer of stresses generated by shrinkage, thermal expansion and the like of the adhesive to the optical region is made difficult. In this structure, each of the first protruding portion and the second protruding portion may include a multi-layer mirror and an electrode of the first electric connector portion. Such a structure can be readily fabricated.

All or almost all of the first substrate may be removed, and a second multi-layer mirror may be formed on a semiconductor surface exposed by the removal of the first substrate. With this structure, no layering in an etched hole is needed, so that the layering of the mirror can be simplified and yield and productivity can be improved. In this structure, the second multi-layer mirror may be a dielectric multi-layer.

The first substrate structure may further include first and second multi-layer mirrors each comprised of a semiconductor multi-layer epitaxially grown on the first substrate. With this structure, the multi-layer mirrors and semiconductor epitaxial layers can be continuously laid down, so its fabrication process can be simplified.

The active region may constitute an edge emitting semiconductor laser.

The anisotropic electrically-conductive adhesive may be an insulating adhesive resin containing electrically-conductive particles. Further, the insulating adhesive resin may be one of thermosetting resin, thermoplastic resin, and ultraviolet-ray-setting resin. Moreover, the anisotropic electrically-conductive adhesive may be an adhesive paste, or an adhesive sheet. With those structures, an anisotropic electric connection can be achieved under a compressive pressure with the application of heat or ultraviolet ray. Further, where the thermoplastic resin is used as the insulating resin, a repair (when the positional deviation of the electrode exists after the bonding, the structures can be used again by re-heating and melting the adhesive to pull apart the structures and clensing them with solvent) is possible and the productivity can be improved.

The second substrate may be made of a material having a large thermal conductivity. Thermal radiation of the structure can be further facilitated.

A fabrication method of an optical device structure for achieving the object of the present invention includes a step of epitaxially growing layers including an active layer on a first substrate, a step of forming at least an active region and at least a first electric connector portion provided corresponding to the active region for injecting a current into or applying a voltage to the active region on the first substrate and constructing a first substrate structure, a step of forming at least a second electric connector portion on a second substrate corresponding to the first electric connector portion and constructing a second substrate structure, and a step of bonding the first and second substrates to each other using an anisotropic electrically-conductive adhesive containing electrically-conductive particles and having an electrically-conductive characteristic only in a direction perpendicular to the first and second substrates, such that the corresponding first and second electric connector portions on the first and second substrates are electrically connected to each other.

The principle of the present invention will be described using an example. In an optical device structure, such as a light emitting device structure and a light receiving device structure, of the present invention for achieving the object, a first substrate structure with at least an optical device, such as VCSEL, formed thereon is bonded to a second substrate structure with at least an electric connector portion (which may include an electric leader wire, an electronic circuit, or the like) formed thereon by using a so-called anisotropic electrically-conductive adhesive, such that predetermined portions of the first and second substrate structures are electrically connected to each other.

Figure 3:
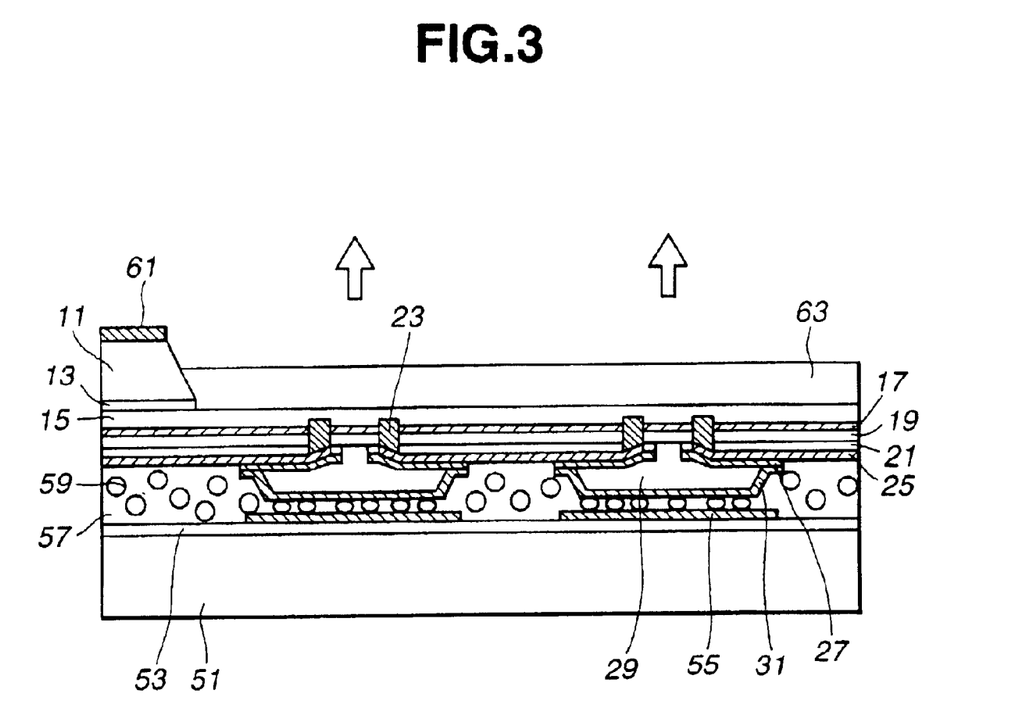
FIG. 3 is a cross-sectional view illustrating the structure of a light emitting device structure of a first embodiment according to the present invention.

In a surface emitting semiconductor laser structure as illustrated in FIG. 3, the first substrate structure includes a first substrate of an InP substrate, semiconductor layers with an active layer epitaxially grown on the first substrate, and a polyimide or the like put in an annularly-etched portion formed around a light emitting region of the semiconductor layer. Further, a portion other than the light emitting region is covered with an insulating layer of $SiN_x$ or the like, an electrode with a window is deposited on the light emitting region, and a contact layer in the window is removed. A dielectric multi-layer mirror is then formed by a RF sputtering method or the like, and the mirror is covered with an electrode connected to the above electrode.

The second substrate structure includes a second substrate of a Si substrate or the like, and an electrode formed on a thermally-oxidized layer formed on a surface of the first substrate. This electrode may be connected to an electric leader wire with a pad, for example.

The anisotropic electrically-conductive adhesive is put on the second substrate structure, and the first and second substrate structures are bonded under a pressure. Here, those substrate structures are aligned such that their electrodes are connected to eahc other.

The anisotropic electrically-conductive adhesive is disclosed in Japanese Patent Application Laid-Open Nos. 62-260877 and 62-165886 (1987), and it is made of insulating adhesive resin containing therein electrically-conductive particles. The insulating adhesive resin is thermosetting resin, thermoplastic resin, or ultraviolet-ray-setting resin. The conductive particle is, for example, a plastic particle coated with gold (Au), or a metal (Ni or the like) particle coated with gold. Though it dependes on its use, the resin normally contains the conductive particles at a volume ratio from 0.1% to 10%. A paste type applicable by printing or the like (trade name TG 90001 produced by Hysol Limited, for example) and a sheet type (trade name FC-100 produced by Hitachi-Chemical Co., for example) are commercially available.

When the anisotropic electrically-conductive adhesive is put between two substrates and compressive pressure and heat are applied thereto, the following occurs in a portion between the electrodes. The conductive particles are deformed and brought into a close contact with the electrodes to achieve an electric connection therebetween. This occurs in the case of relatively soft particles such as plastic particles, and an electric resistance thereat is small due to an increase in the contact area. In another case, parts of the conductive particles are pushed into the electrodes to achieve an electric connection therebetween. This occurs in the case of relatively hard particles such as Ni particles, and an electric connection thereat is assuredly established due to breaks in oxidized layers on the electrodes.

In the other portions, the conductive particles are floating in the insulating resin, so that no electric connection is obtained. Thus, an anisotropic electric conductivity, in which an electric conduction is established in vertical directions while insulation is assured in horizontal directions, can be attained.

An ordinary electrically-conductive adhesive, such as silver (Ag) paste, is also a combination of resin and electrically-conductive particles in most cases, but the resin generally contains the conductive particles at a volume ratio of about 80%. Therefore, in those cases the electric conduction is also established in the horizontal directions, and the anisotropic electric conductivity cannot be achieved.

Diameters of the conductive particles are from about 1 $\mu$m to about 10 $\mu$m, and an appropriate one may be selected depending on the shape of the substrate to be bonded. When the particle having a diameter of 4 $\mu$m is selected, the interval between the first and second substrate structures comes to be less than 4 $\mu$m. This value is one order smaller than that of the case using solder bumps (see FIG. 1), so an excellent thermal radiation characteristic can be achieved. Further, compared to the case where the electrodes are directly connected and surroundings thereof are set with resin (see FIG. 2), the connection can be achieved without any problem even if dusts and the like with about the same diameter as that of the particles exist. Thus, yield can be improved. Those hold true in the case of an ordinary edge emitting semiconductor laser, as well as a surface emitting semiconductor laser.

Further, thermoplastic resin may be used as the insulating resin. In this case, even when the positional deviation of the electrode exists after the bonding, the structures can be used again by re-heating and melting the adhesive to pull apart the structures and clensing them with solvent. Thus, the productivity can be improved.

In the optical device structure of the present invention, since the second substrate can be used as a support substrate, the first substrate of the first substrate structure can be readily removed without performing a partial hole-etching for each active region. Hence, especially in the surface emitting semiconductor laser, the yield can be improved and a high-dense arraying can be realized.

This will be described using FIG. 3. After the first substrate structure is bonded to the second substrate structure, almost overall the first substrate is removed using a selective wet etching or the like. After the removal, the thickness of the semiconductor layers comes to be in a range from 1 $\mu$m to several microns. In this situation, the size of the bonding portion or a portion of the multi-layer mirror is made larger than the diameter of the active region, so that transfer of stresses generated by shrinkage, thermal expansion and the like of the resin to the optical region is made difficult. Therefore, characteristics of the optical device would not be injured even when the growth substrate is removed.

The dielectric multi-layer mirror is then formed on the semiconductor surface exposed by the removal of the substrate (this mirror can be omitted in the case of LED). In this case, such formation is equivalent to a deposition of the mirror on a flat substrate, so the yield can be improved compared to the case of a deposition thereof in a hole.

These advantages and others will be more readily understood in connection with the following detailed description of the preferred embodiments in conjunction with the drawings.

DESCRIPTION OF THE PREFERRED EMBODIMENTS

First Embodiment

A first embodiment of the present invention will be described withreference to FIGS. 3, 4A–4H and 5A–5D. FIG. 1 depicts a cross section of an array structure of surface emitting semiconductor lasers of the first embodiment. FIGS. 4A–4H and 5A–5D illustrate fabrication steps of the first embodiment.

Figure 4A:
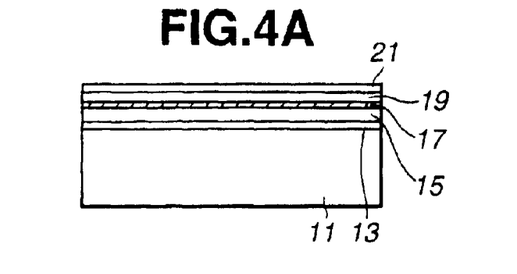
FIGS. 4A through 4H are respectively cross-sectional views illustrating fabrication steps of a first substrate structure of the first embodiment.

Initially, a first substrate structure will be described referring to FIGS. 4A–4H. As illustrated in FIG. 4A, an n-InGaAs etching stop layer 13 having a thickness of 0.2 $\mu$m, an n-InP spacer layer 15 having a thickness of 2.0 $\mu$m, an undoped InGaAsP bulk active layer 17 having a thickness of 0.7 $\mu$m and a bandgap wavelength of 1.3 $\mu$m, a p-InP spacer layer 19 having a thickness of 1.0 $\mu$m, and a p-InGaAsP contact layer 21 having a thickness of 0.2 $\mu$m are grown on an n-InP substrate 11 in the named order using a growth method, such as metal organized chemical vapor deposition (MOCVD), molecular beam epitaxy (MBE), or chemical beam epitaxy (CBE).

Figure 4B:
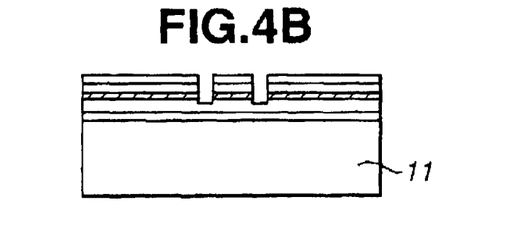
Figures 4C, 4H:
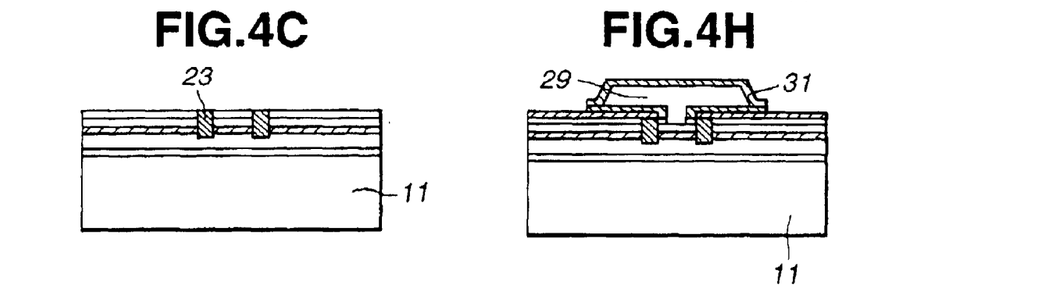

A portion around each light emitting region is then etched in an annular shape using RIBE, for example, and the etched portion is buried with a polyimide 23 (FIGS. 4B and 4C). The light emitting region has a cylindrical shape with a diameter of 20 $\mu$m, and an outer diameter of the annular etched portion is 40 $\mu$m, for example. Though not depicted in FIGS. 4A–4H, the periphery of the active layer 17 may be selectively etched to a diameter of 15 $\mu$m by using an etchant of sulfuric acid series, corresponding to an effective diameter of a multi-layer mirror to be formed later, before the etched portion is buried with the polyimide 23.

Figure 4D:
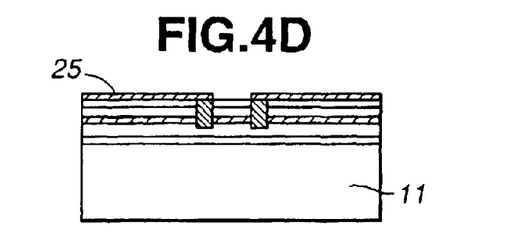
Figure 4E:
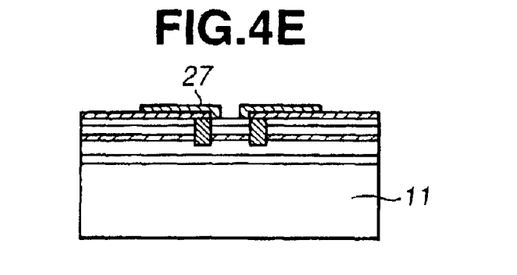
Figure 4F:
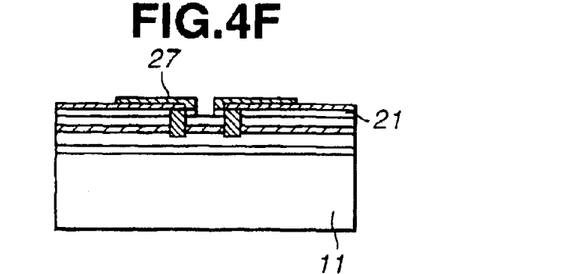
Figure 4G:
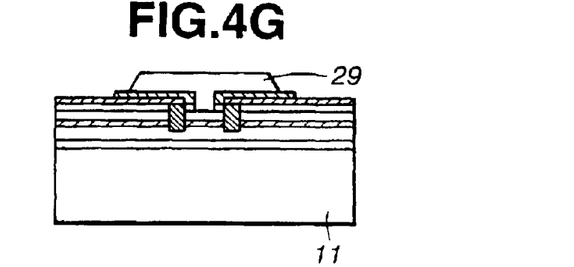

After a portion outside the light emitting region is covered with a layer 25 of $SiN_x$ to obtain the insulation over this portion, a p-electrode 27 of Cr/Au with a thickness of 0.5 $\mu$m and a window of a 15 $\mu$m diameter is deposited and the contact layer 21 in the window is removed, as illustrated in FIGS. 4D, 4E and 4F. Then, a multi-layer mirror 29 of $Al_2O_3$/Si with a thickness of 2.5 $\mu$m and a diameter of 100 $\mu$m is formed, and the mirror 29 is covered with an Au-electrode 31 having a thickness of 0.5 $\mu$m (see FIGS. 4G and 4H). The elctrode 31 is electrically connected to the electrode 27. The formation of a bonding side of the first substrate structure is thus finished.

The bonding process of first and second substrate structures will be described referring to FIGS. 5A–5D. In a left part of FIG. 5A, the first substrate structure fabricated in the above step is depicted upside down. The substrate 11 of the first substrate structure may be polished to a thickness of about 100 μm to simplify a removing step of the substrate 11 to be performed later.

A second substrate structure is fabricated by forming an electrode 55 of Cr/Au with a thickness of 1 μm, for example, after forming a thermally-oxidized layer 53 on a Si substrate 51. Though not depicted in FIGS. 5A–5D, the electrode 55 is connected to an electric leader wire with a pad. The thus-fabricated second substrate structure is then coated with a thermosetting resin 57 containing electrically-conductive prticles 59, as illustrated in a right part of FIG. 5A. The conductive particle 59 is a Ni particle coated with Au, and its diameter is approximately 4 μm.

Figure 5A:
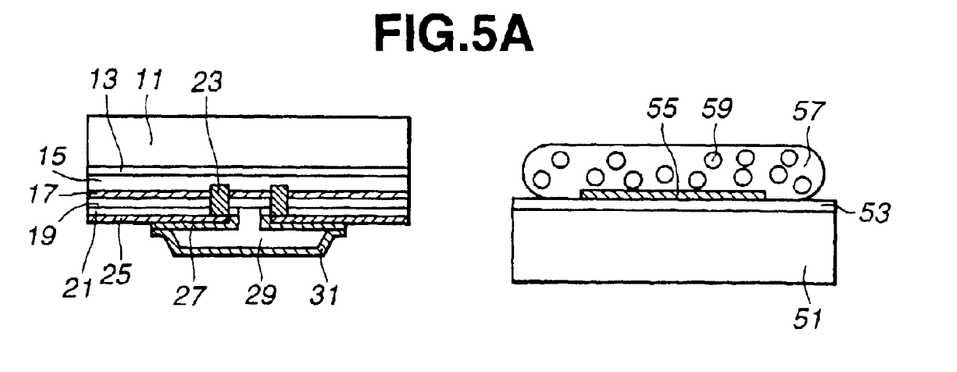
FIGS. 5A through 5D are respectively cross-sectional views illustrating steps of bonding first and second substrate structures to each other in the first embodiment.
Figure 5B:
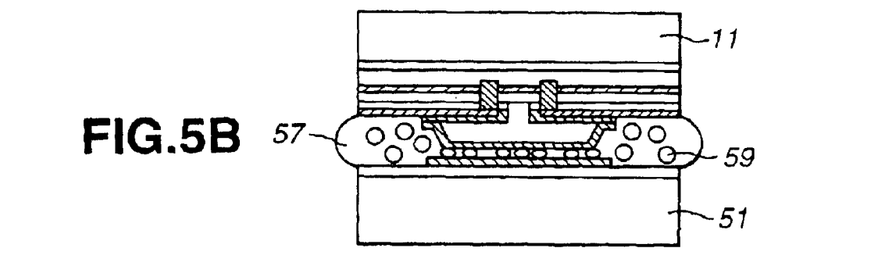

The bonding between the first and second substrate structures is executed by bringing their electrode portions 31 and 55 into contact with each other and setting the resin 57 by heating it to 200° C. while applying a pressure of 3 kgf/cm² thereto (FIG. 5B). The conductive particles 59 sandwiched between the electrodes 31 and 55 are partly deformed and pushed into those electrodes by the heating and pressing, so that electric conduction is established between upper and lower electrode portions. In contrast, the particles 59 are floating in the resin 57 in the other portions, so no such electric conduction can be obtained.

With the thus-executed bonding, the interval between the first and second substrate structures is less than 4 μm. This value is one order smaller than that of the case of solder bumps (the case of FIG. 1). The device of the present invention is thus superior in its thermal radiation. Further, compared to the case (the case of FIG. 2) where electrodes are directly connected and its surroundings are filled with the resin, the electric connection can be achieved without any problem in this embodiment even if insulating dusts and the like of about the same diameter as that of the particle 59 are present. Thus, the yield can be improved.

Figure 5C:
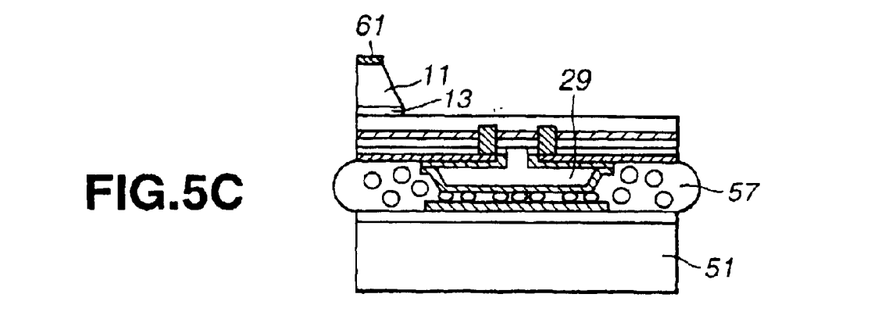

Then, after an n-electrode 61 of AuGe/Au is partly deposited on the substrate 11, the substrate 11 is etched down to the etching stop layer 13 using an etchant of chloric acid series, except its outer portion. Further, the etching stop layer 13 is removed by an etching using an etchant of sulfuric acid, as illustrated in FIG. 5C. Here, since the etching is performed over the almost overall region, the etching process can be simplified and the yield can be improved, compared to the case of the hole etching. Upon removal of the substrate 11, the thickness of semiconductor layers comes to be about 4 μm. In this situation, the size of the bonding portion or a portion of the multi-layer mirror 29 is made considerably larger than the diameter of the light emitting region, so that transfer of stresses generated by shrinkage, thermal expansion and the like of the resin 57 to the light emitting region is made difficult. Therefore, characteristics of the laser would not be injured even when the substrate 11 is removed.

Figure 5D:
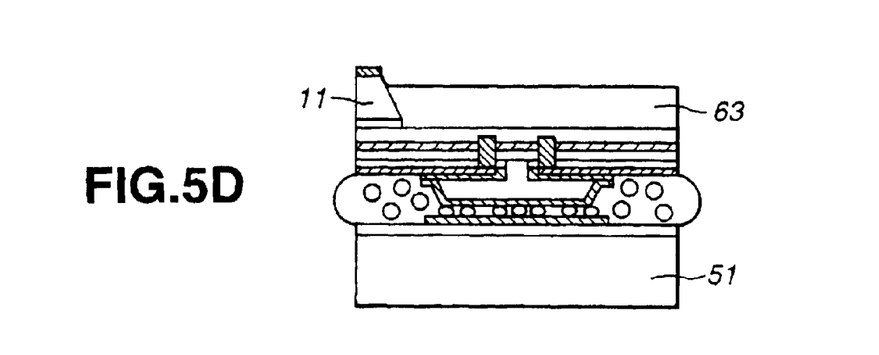

A multi-layer mirror 63 of Al$_2$O$_3$/Si is then formed on the semiconductor surface exposed by the removal of the substrate 11 and the etching stop layer 13 (FIG. 5D). In this case, such a formation of the mirror 63 is equivalent to a deposition thereof on a flat substrate, so its yield can be improved compared to the case of a deposition thereof in a hole.

When a 4×4 array of surface emitting semiconductor lasers is fabricated by using the above method, almost no variations occur among the lasers in characteristics of threshold, oscillation wavelength, power and so forth. Each semiconductor laser is operated by injecting a current between the common electrode 61 and a desired one of the electrodes 55 through the electric leader wire.

In this embodiment, electrodes of an electronic circuit may be fomed on the second substrate structure, in place of the electric leader wire, and the material of the substrate 51 may be other than Si, for example, AlN.

Further, though the conductive particle is the Ni particle coated with Au in this embodiment, but the particle is not limited thereto and may be a plastic particle coated with Au. The particle diameter may also be appropriately selected in accordance with the structure.

Regarding the resin, ultraviolet-ray setting resin may be used. In this case, the substrate 51 of the second substrate structure is desirably a type which transmits ultraviolet rays. In addition, a resin sheet produced by shaping a resin containing coductive particles into a sheet may be inserted between the first and second substrate structures, and the bonding may be performed by applying pressure and heat thereto.

Further, thermoplastic resin may be used. In this case, even if the positional deviation of the electrodes exists after the bonding, the structures can be used again by re-heating and melting the adhesive to pull apart the structures and clensing them with a solvent. Thus, the productivity can be improved.

In this embodiment, the n-electrode 61 is deposited after the bonding process, but this deposition may be carried out prior to the bonding process. Further, the active layer 17 may be a multiple quantum well (MQW) layer in place of the bulk layer. The laser structure can also be fabricated by using a p-InP substrate.

The materials of the multi-layer mirrors 29 and 63 are not limited to Al$_2$O$_3$/Si, and SiO$_2$/Si, MgO/Si, or the like can also be used.

Second Embodiment

Figure 6:
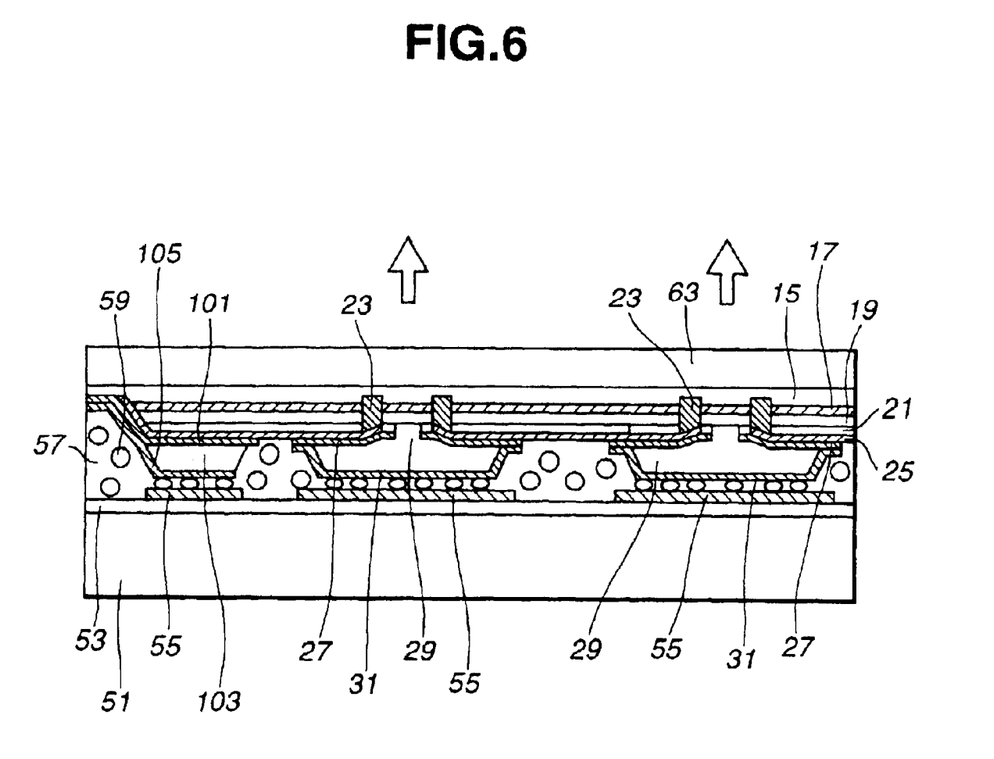
FIG. 6 is a cross-sectional view illustrating the structure of a light emitting device structure of a second embodiment according to the present invention.

A second embodiment of the present invention will be described with reference to FIG. 6. FIG. 6 depicts a cross section of an array structure of surface emitting semiconductor lasers of the second embodiment. In the second embodiment, both p-side and n-side electrodes are taken from the side of a second substrate structure. The construction of the second embodiment is approximately the same as that of the first embodiment, and detailed descriptions of the same portions are therefore omitted. In FIG. 6, the same elements as those in FIG. 3 are denoted by the same reference numerals.

In the second embodiment, a first substrate structure is etched such that an n-InP spacer layer 15 is exposed in a portion excluding light emitting regions. In the exposed portion, an n-electrode 101 is deposited to obtain a contact on the n-side. Here, when both n-electrode 101 and p-electrode 27 are formed of such material as can cope with both polarities, Ti/Pt/Au, for example, those electrodes can be simultaneously deposited.

When a multi-layer mirror 29 is deposited, a bump 103 of the same structure as this mirror 29 is formed at the same time, and an electrode 105 of Au is formed thereon. The thus-fabricated first substrate structure is bonded to the second substrate structure in a manner similar to the first embodiment.

Thereafter, a substrate 11 and an etching stop layer 13 are wholly removed, and a multi-layer mirror 63 is deposited on the removed portion. The second embodiment is superior to the first embodiment in that there is no need of leaving a region for the n-electrode on the side of the substrate 11 and its fabrication is hence further simplified. Moreover, since both the n-electrode and p-electrode are taken from the side of the second substrate structure, the packaging of the structure in an IC package, for example, can be readily carried out. When an electronic circuit is formed on the second substrate structure, matching between the two substrate structures is excellent. Regarding other points, the second embodiment is the same as the first embodiment.

Third Embodiment

Figure 7:
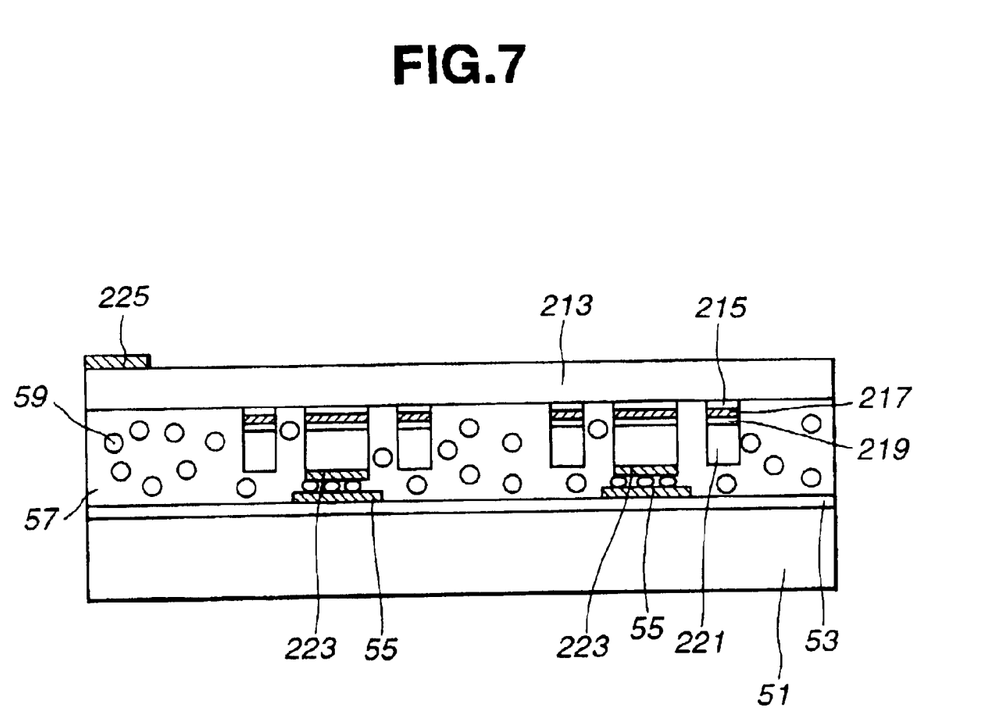
FIG. 7 is a cross-sectional view illustrating the structure of a light emitting device structure of a third embodiment according to the present invention.

A third embodiment of the present invention will be described with reference to FIG. 7. FIG. 7 depicts a cross section of an array structure of surface emitting semiconductor lasers of the third embodiment. A second substrate structure of this embodiment is substantially the same as that of the first embodiment, and portions thereof are denoted by the same reference numerals.

A first substrate structure of the third embodiment will be described. As illustrated in FIG. 7, a semiconductor multi-layer mirror 213 of n-$Al_{0.1}Ga_{0.9}As$/n-AlAs, an undoped-$Al_{0.6}Ga_{0.4}As$ spacer layer 215 having a thickness of 0.11 $\mu$m, a quantum well active layer 217 of undoped-$In_{0.3}Ga_{0.7}As$/undoped-GaAs having a bandgap wavelength of 0.85 $\mu$m, an undoped-$Al_{0.6}Ga_{0.4}As$ spacer layer 219 having a thickness of 0.11 $\mu$m, and a semiconductor multi-layer mirror 221 of p-$Al_{0.1}Ga_{0.9}As$/p-AlAs are grown on an n-GaAs substrate (not depicted in FIG. 7 for the substrate is removed later) in the named order, using MOCVD, MBE, CBE or the like.

A cylindrical light emitting region surrounded by an annular bump with a space therebetween is then formed by etching, such as RIBE. The light emitting region has a diameter of 25 $\mu$m, for example. The annular bump has an inner diameter of 50 $\mu$m and an outer diameter of 90 $\mu$m. Though not depicted in FIG. 7, AlAs of the semiconductor multi-layer mirror 221 in the light emitting region may be selectively oxidized to form a current constriction structure. Then, a p-electrode 223 of Ti/Pt/Au is deposited on the multi-layer mirror 221 in the light emitting region, and a process of the bonding side of the first substrate structure is thus completed.

After the thus-fabricated first substrate structure is bonded to the second substrate structure in a manner similar to the first embodiment, the overall n-GaAs substrate (not depicted in FIG. 7) is removed and an n-electrode 225 of Ti/Pt/Au is deposited on a portion outside the light emitting regions.

In the surface emitting semiconductor laser in this embodiment, the growth substrate must be removed because this is not transparent to the oscillation wavelength. In this embodiment, the bump is formed around the light emitting region with a height a little smaller than the cylindrical light emitting region, so that transfer of stresses caused by shrinkage and thermal expansion of a resin 57 to the light emitting region is made difficult. As a result, the laser characteristics would not be impaired even if the growth substrate is all removed. Further, since the n-GaAs substrate (not depicted in FIG. 7) can be all removed with the second substrate structure acting as a support substrate, the process is simplified and the yield is improved.

When a 4×4 array of surface emitting semiconductor lasers is fabricated by using the above method, almost no variations occurs among the lasers in characteristics of threshold, oscillation wavelength, power and so forth.

In this embodiment, the n-electrode 225 is deposited after the bonding process of the first substrate structure to the substrate 51, but this deposition may be made prior to the bonding process. Further, the active layer 217 may be a bulk layer in place of the MQW layer. The laser can also be fabricated by using a p-GaAs substrate as well.

Fourth Embodiment

Figure 8:
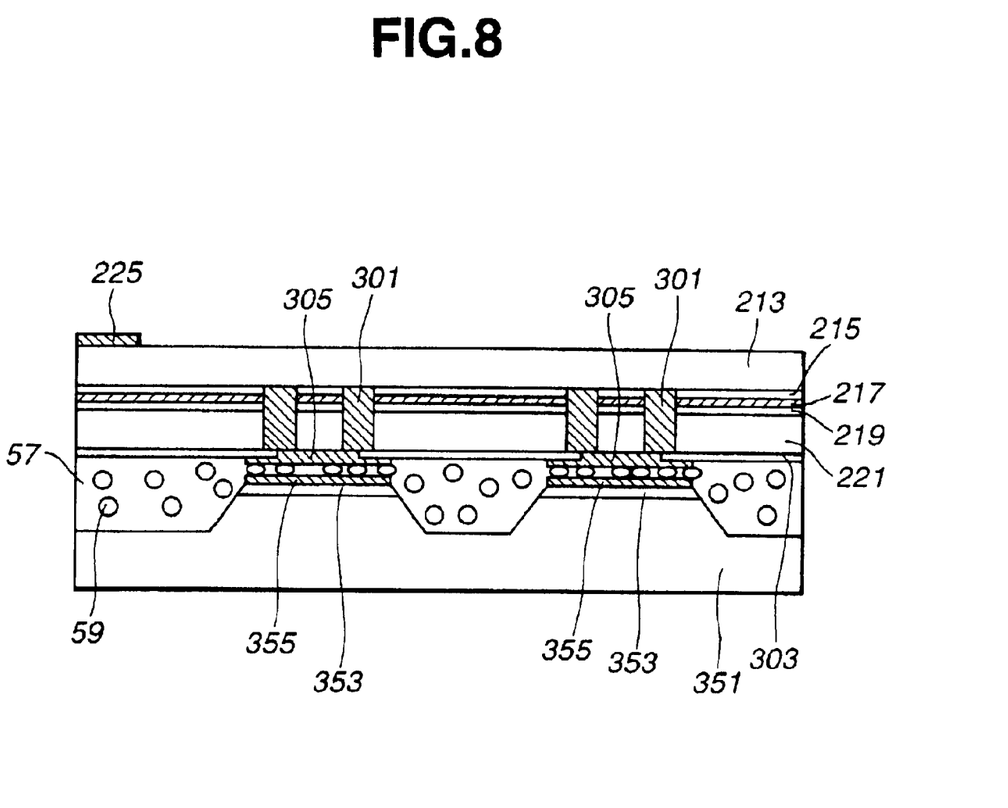
FIG. 8 is a cross-sectional view illustrating the structure of a light emitting device structure of a fourth embodiment according to the present invention.

A fourth embodiment of the present invention will be described with reference to FIG. 8. FIG. 8 depicts a cross section of an array structure of surface emitting semiconductor lasers of the fourth embodiment. Semiconductor layers of a first substrate structure of this embodiment are the same as those of the third embodiment, and portions thereof are denoted by the same reference numerals.

The first substrate structure of the fourth embodiment will be described. As illustrated in FIG. 8, after semiconductor layers are grown on an n-GaAs substrate (not depicted in FIG. 8 as the substrate is removed later), surroundings of each light emitting region are etched in an annular shape using RIBE, for example. The etched portion is buried with a polyimide 301. The cylindrical light emitting region has a diameter of 25 $\mu$m, for example. The annular etched portion has an outer diameter of 50 $\mu$m. Though not depicted in FIG. 8, AlAs of a semiconductor multi-layer mirror 221 in the light emitting region may be selectively oxidized before the burying with the polyimide 301 to form a current constriction structure thereat. Then, a circular p-electrode 305 of Ti/Pt/Au with a diameter of 80 $\mu$m is deposited after the insulation of a region other than the light emitting regions is made by covering the region with a $SiN_x$ 303. The fabrication of the bonding side of the first substrate structure is thus completed.

Regarding the second substrate structure, after a thermally-oxidized film 353 is formed on a Si substrate 351, an electrode 355 of Cr/Au with a thickness of 1 $\mu$m, for example, is formed. Etching is then performed to a depth of about 5 $\mu$m in a region other than the electric connector portion. Though not depicted in FIG. 8, the electrode 355 is connected to an electric leader wire with a pad. After the thus-fabricated first and second substrate structures are bonded to each other in a manner similar to the first embodiment, all the n-GaAs substrate (not depicted in FIG. 8) is removed, and an n-electrode 225 of Ti/Pt/Au is formed on a portion outside the light emitting regions.

Also in this embodiment, since the electric connector portion is considerably larger than the light emitting region, transfer of stresses due to shrinkage and thermal expansion of a resin 57 to the light emitting region is unlikely to occur. Further, since the second substrate 351 is beforehand etched in a non-electric-connector portion on the second substrate structure, unneeded resin can be effectively pushed out of the electric connector portion during a pressure application step. Furthermore, since the gap between the first and second substrate structures in the non-electric-connector portion is larger than the diameter of particles 59 in the resin 59, the insulation can be established without fail.

In this embodiment, electrodes of an electronic circuit may be provided on the second substrate structure in place of the electric leader wire. Material of the substrate may be other than Si, for example, AlN. Further, both the p-electrode and n-electrode may be taken from the side of the second substrate, similarly to the second embodiment. Operation and so forth of this embodiment are the same as those of the above embodiments.

In the first to fourth embodiments, the light emitting region may be formed as a light emitting diode (LED) by omitting the reflection mirror on the light takeout side.

Fifth Embodiment

Figure 9:
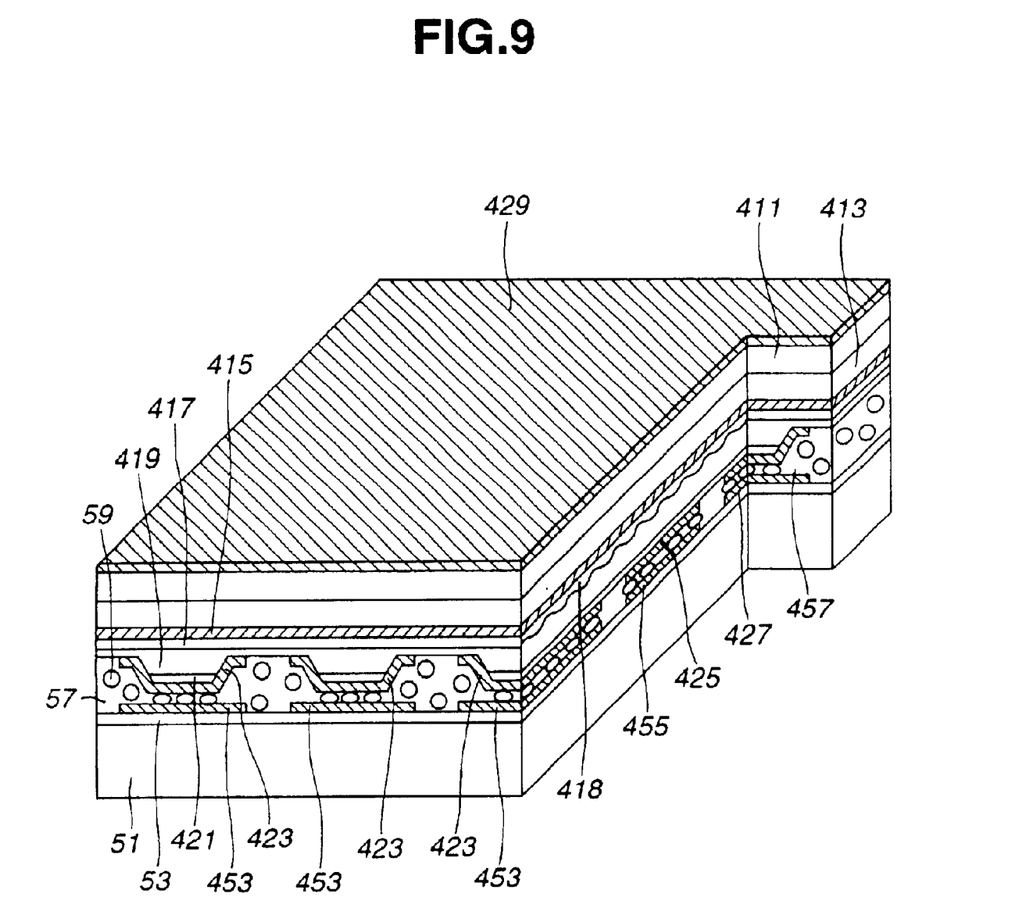
FIG. 9 is a perspective view illustrating the structure of a light emitting device structure of a fifth embodiment according to the present invention.

The present invention can be applied not only to a surface emitting semiconductor laser but an edge emitting semiconductor laser such as an ordinary distributed feedback (DFB)

laser. A fifth embodiment of the present invention will be described with reference to FIG. 9. FIG. 9 depicts a perspective view of an array atructure of edge emitting semiconductor lasers of the fifth embodiment.

Initially, a first substrate structure will be described referring to FIG. 9. As illustrated in FIG. 9, an n-InGaAsP waveguide layer 413, an undoped InGaAsP bulk active layer 415 having a bandgap wavelength of 1.3 µm, a p-InGaAsP grating layer 417, a p-InP clad layer 419, and a p-InGaAsP contact layer 421 are grown on an n-InP substrate 411 in the named order, using MOCVD, MBE, CBE, or the like. A diffraction grating 418 is formed on the grating layer 417.

The clad layer 419 and the contact layer 421 are then etched in a ridge form, and p-electrodes 423, 425 and 427 of Cr/Au are formed thereon. Finally, an n-electrode 429 of AuGe/Au is deposited. Antireflection layers (not depicted in FIG. 9) are provided on opposite end faces of the laser region, respectively. In this embodiment, an array of DFB lasers is formed, in a cavity of which three independent current injection regions are arranged in a light propagation direction.

In a second substrate structure, electrodes 453, 455 and 457 corresponding to the p-electrodes 423, 425 and 427 are deposited on a thermally-oxidized layer 53 of a Si substrate 51. Though not depicted in FIG. 9, those electrodes 453, 455 and 457 are connected to electric leader wires with pads, respectively. The thus-fabricated first and second substrate structures are bonded in a manner similar to the first embodiment, and the DFB laser array is thus constructed.

Each laser is driven by injecting a current through the second substrate structure. In each laser, oscillation wavelength can be changed by controlling amounts of currents injected into the respective current injection regions.

In this embodiment, when an adhesive 57 containing particles 59 with a diameter of 4 µm is used, the interval between the first and second substrate structures comes to be less than 4 µm. Accordingly, a laser array with excellent thermal radiation and can be built with a high yield.

In this embodiment, a MQW active layer can be used as active layer. Further, the DFB laser can be replaced by a distributed Bragg reflector (DBR) laser or a Fabry-Perot laser. A two-electrode structure or a single-electrode laser structure can also be used.

As described in the foregoing, according to the present invention, an optical device structure, such as a light emitting device structure and a light detecting device structure, with excellent thermal radiation can be readily realized.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical device structure comprising:

a first substrate structure, said first substrate structure including a first substrate, at least an active region formed on said first substrate, and at least a first electric connector portion provided corresponding to said active region for injecting a current into or applying a voltage to said active region;

a second substrate structure, said second substrate structure including a second substrate, and at least a second electric connector portion formed on said second substrate corresponding to said first electric connector portion; and an anisotropic adhesive containing electrically-conductive particles, said first and second substrates being bonded to each other by said anisotropic adhesive, and said first and second electric connector portions on said first and second substrates being electrically connected to each other by said electrically-conductive particles between said first and second electric connector portions, wherein said active region comprises a light emitting region.

2. An optical device structure comprising:

a first substrate structure, said first substrate structure including a first substrate, at least an active region formed on said first substrate, and at least a first electric connector portion provided corresponding to said active region for injecting a current into or applying a voltage to said active region;

a second substrate structure, said second substrate structure including a second substrate, and at least a second electric connector portion formed on said second substrate corresponding to said first electric connector portion; and an anisotropic adhesive containing electrically-conductive particles, said first and second substrates being bonded to each other by said anisotropic adhesive, and said first and second electric connector portions on said first and second substrates being electrically connected to each other by said electrically-conductive particles between said first and second electric connector portions, wherein said active region comprises a light emitting region, and wherein said first substrate structure further includes a first multi-layer mirror, epitaxially-grown semiconductor layers including an active layer of said light emitting region, and a second multi-layer mirror to construct a surface emitting semiconductor laser for emitting light from a side of said first substrate.

3. An optical device structure comprising:

a first substrate structure, said first substrate structure including a first substrate, at least an active region formed on said first substrate, and at least a first electric connector portion provided corresponding to said active region for injecting a current into or applying a voltage to said active region;

a second substrate structure, said second substrate structure including a second substrate, and at least a second electric connector portion formed on said second substrate corresponding to said first electric connector portion; and an anisotropic adhesive containing electrically-conductive particles, said first and second substrates being bonded to each other by said anisotropic adhesive, and said first and second electric connector portions on said first and second substrates being electrically connected to each other by said electrically-conductive particles between said first and second electric connector portions, wherein said active region comprises a light emitting region, and wherein said first substrate structure further includes a first and second multi-layer mirror.

4. An optical device structure as in any one of claims 1–3, wherein said second substrate structure further includes at least one of an electric leader wire and an electronic circuit formed on said second substrate and connected to said second electric connector portion.

5. An optical device structure as in any one of claims 1–3, wherein each of said first and second electric connector portions includes an electrode formed on a surface of each of said first and second substrates, and wherein an uppermost surface of at least one of said electrodes protrudes from the surface of said at least one electrode's corresponding substrate such that an interval between said electrodes on said first and second substrates is smaller than an interval between the surfaces of said first and second substrates.

6. An optical device structure according to claim 5, wherein said uppermost surface of said at least one electrode protrudes from the surface of the corresponding substrate such that the interval between the surfaces of said first and second substrates is larger than a diameter of said electrically-conductive particle.

7. An optical device structure as in any one of claims 1–3, wherein an insulating layer is provided on at least one of said first and second substrates except for regions of said first and second electric connector portions.

8. An optical device structure as in any one of claims 1–3, wherein an area of said first electric connector portion is larger than an area of said active region.

9. An optical device structure as in any one of claims 1–3, wherein said first substrate structure further includes first and second multi-layer mirrors each comprised of a semiconductor multi-layer epitaxially grown on said first substrate.

10. An optical device structure as in any one of claims 1–3, wherein said active region constitutes an edge emitting semiconductor laser.

11. An optical device structure as in any one of claims 1–3, wherein said anisotropic adhesive comprises an insulating adhesive resin containing electrically-conductive particles.

12. An optical device structure according to claim 11, wherein said insulating adhesive resin comprises one of thermosetting resin, thermoplastic resin, and ultraviolet-ray-setting resin.

13. An optical device structure according to claim 11, wherein said anisotropic adhesive comprises an adhesive paste.

14. An optical device structure according to claim 11, wherein said anisotropic adhesive comprises an adhesive sheet.

15. An optical device structure as in any one of claims 1–3, wherein said second substrate is made of a material having a large thermal conductivity.

16. An optical device structure according to claim 2, wherein said first and second multi-layer mirrors are each comprised of a semiconductor multi-layer epitaxially grown on said first substrate.

* * * * *

UNITED STATES PATENT AND TRADEMARK OFFICE
CERTIFICATE OF CORRECTION

PATENT NO. : 6,771,677 B2
DATED : August 3, 2004
INVENTOR(S) : Yukio Furukawa et al.

It is certified that error appears in the above-identified patent and that said Letters Patent is hereby corrected as shown below:

Title page,
Item [56], References Cited, FOREIGN PATENT DOCUMENTS,
"JP 0 704 947 3/1996" should read -- EP 0 704 947 3/1996 --; and
OTHER PUBLICATIONS, "D. D. Chang et al., reference,
"Nw" should read -- New --;
"1 D cember" should read -- 1 December --; and
"*pag" should read -- *page --.
Item [57], ABSTRACT,
Line 13, "elctrically-conductive" should read -- electrically-conductive --.

Column 1,
Line 20, "emittiing" should read -- emitting --; and
Line 55, "mitting" should read -- emitting --.

Column 5,
Line 47, "clensing" should read -- cleansing --.

Signed and Sealed this

Fourteenth Day of December, 2004

JON W. DUDAS
*Director of the United States Patent and Trademark Office*